(12) United States Patent
Garrec et al.

(10) Patent No.: US 10,340,942 B2
(45) Date of Patent: Jul. 2, 2019

(54) DEVICE FOR GENERATING ANALOGUE SIGNALS AND ASSOCIATED USE

(71) Applicants: THALES, Courbevoie (FR); UNIVERSITE DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR)

(72) Inventors: Patrick Garrec, Merignac (FR); Richard Montigny, Pessac (FR); François Rivet, Talence (FR); Yann Deval, Bordeaux (FR); Yoan Veyrac, Pessac (FR)

(73) Assignees: THALES, Courbevoie (FR); UNIVERSITE DE BORDEAUX, Bordeaux (FR); INSTITUT POLYTECHNIQUE DE BORDEAUX, Talence (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/768,815

(22) PCT Filed: Oct. 10, 2016

(86) PCT No.: PCT/EP2016/074148
§ 371 (c)(1),
(2) Date: Apr. 16, 2018

(87) PCT Pub. No.: WO2017/067804
PCT Pub. Date: Apr. 27, 2017

(65) Prior Publication Data
US 2018/0287627 A1   Oct. 4, 2018

(30) Foreign Application Priority Data
Oct. 21, 2015  (FR) ..................... 15 02229

(51) Int. Cl.
*H03M 3/00* (2006.01)
*H03K 4/02* (2006.01)
(Continued)

(52) U.S. Cl.
CPC ............ *H03M 3/502* (2013.01); *H03K 4/023* (2013.01); *H03M 1/1245* (2013.01); *H03M 1/742* (2013.01)

(58) Field of Classification Search
CPC ...... H03M 3/502; H03M 1/0631; H03M 3/34; H03M 3/368; H03M 3/504; H03M 7/3037
(Continued)

(56) References Cited

U.S. PATENT DOCUMENTS 5,977,899 A * 11/1999 Adams .................... H03M 3/50
341/143
7,307,568 B1 * 12/2007 Nhuyen .............. H03M 1/0872
341/118
(Continued)

FOREIGN PATENT DOCUMENTS

WO   2014/184388 A1   11/2014

OTHER PUBLICATIONS

Y. Veyrac et al., "The Riemann pump: A concurrent transmitter in GaN technology," 2014 21st IEEE International Conference on Electronics, Circuits and Systems, Dec. 7, 2014, pp. 594-597, XP032740100.
(Continued)

*Primary Examiner* — Linh V Nguyen
(74) *Attorney, Agent, or Firm* — Baker & Hostetler LLP

(57) ABSTRACT

An analog signals generating device comprises a current pump controlled by a control code generated by a module for calculating the digital code with shaping of noise. The calculation module receives as input a digital signal representative of the analog signal to be generated and comprises
(Continued)

at least one quantizer and a quantization error compensating stage. The current pump comprises two groups of at least one electric current generator and two groups of at least one switching means, the switching facilities being controlled by the control signal and causing the electric currents to flow between the electric current generators and the inputs of a differential amplifier exhibiting a predominantly capacitive input impedance and connected in series between the two groups of switching means.

5 Claims, 5 Drawing Sheets

(51) Int. Cl.
*H03M 1/74* (2006.01)
*H03M 1/12* (2006.01)
(58) Field of Classification Search
USPC .......................................... 341/143, 144, 110
See application file for complete search history.

(56) References Cited

U.S. PATENT DOCUMENTS

| 7,969,340 | B2* | 6/2011 | Lou | H03M 7/3033 |
|---|---|---|---|---|
| | | | | 341/143 |
| 7,986,255 | B2* | 7/2011 | Mahooti | H03M 1/069 |
| | | | | 318/594 |
| 8,519,877 | B1* | 8/2013 | Baranwal | H03M 1/0604 |
| | | | | 341/144 |
| 9,397,676 | B1* | 7/2016 | Nguyen | H03M 1/002 |
| 2002/0063644 | A1* | 5/2002 | Clara | H03M 1/0682 |
| | | | | 341/136 |
| 2006/0145902 | A1 | 7/2006 | Tucholski | |
| 2007/0159370 | A1* | 7/2007 | Baginski | H03H 19/004 |
| | | | | 341/144 |
| 2009/0135033 | A1* | 5/2009 | Huppertz | H03M 3/384 |
| | | | | 341/118 |
| 2010/0315274 | A1* | 12/2010 | Werking | H03M 3/35 |
| | | | | 341/143 |

OTHER PUBLICATIONS

S. Tewksbury et al., "Oversampled, linear predictive and noise-shaping coders of order N > 1," IEEE Transactions on Circuits and Systems, vol. 25, No. 7, Jul. 1978, pp. 436-447, XP055286242.

J. Gibson, "Adaptive Prediction in Speech Differential Encoding Systems," Proceedings of the IEEE, vol. 68, No. 4. Apr. 1, 1980, pp. 488-525, XP055285451.

* cited by examiner

DEVICE FOR GENERATING ANALOGUE SIGNALS AND ASSOCIATED USE

CROSS-REFRENCE TO RELATED APPLICATIONS

This application is a national stage of International patent application PCT/EP2016/074148, Oct. 10, 2016, which claims priority to foreign French patent application No. FR 150229, filed on Oct. 21, 2015, the disclosure of which are incorporated by reference in their entirety.

FIELD OF THE INVENTION

The present invention relates to the field of signals generation. The present invention relates more particularly to a device for generating analog signals and its associated use.

BACKGROUND

A particular application of the device according to the invention relates to the emission of analog signals within the context of software radio, and more particularly for the fifth generation of mobile telephony standards (5G).

In a general manner, the signals generating device can find its application in any field implementing the generation of analog signals on the basis of a digital code, such as the generating of radar signals, of jamming signals, of telecommunication signals, the generating of interleaved signals, etc.

Hitherto, radio signals were generated in baseband in the digital domain, converted to the analog domain and then raised to radiofrequency by multiplying by a carrier signal to lead to an amplifier. A drawback of this method is that it integrates the frequency raising part in the analog domain, the non-linearities of the amplifier therefore cannot be compensated in the digital domain since the signal once converted into analog is thereafter mixed with another analog signal. With this method, only the baseband errors can be compensated. Moreover this method is rather inflexible and non-reconfigurable.

Another method consists in raising the frequency in the digital domain by Direct Digital Synthesis (DDS). This second method also lacks flexibility since the frequency raising operation implements a carrier frequency which is a multiple of the working frequency, thereby limiting the range of carrier frequencies that it is possible to generate.

There is also known, in particular from patent application FR 13 01142, a system for generating an analog signal. However, this system uses a zero-order integration, and therefore the errors produced are sizable with respect to a first order integration.

An aim of the invention is in particular to correct all or some of the drawbacks of the prior art by proposing a reconfigurable solution making it possible to generate arbitrary analog signals on the basis of a digital coding, limiting disturbances and consuming little energy.

SUMMARY OF THE INVENTION

For this purpose, the subject of the invention is a device for generating analog signals comprising a current pump controlled by a digital control code generated by a module for calculating the digital code with shaping of noise, said module for calculating the digital code with shaping of noise comprising at least one quantizer and receiving at its input a digital signal representative of the analog signal to be generated, said module for calculating the digital code with shaping of noise comprising a quantization error compensating stage, and said current pump comprising:
  a first and a second group of at least one electric current generator, each generator of the first group being complementary to a generator of the second group, two complementary generators delivering currents of opposite amplitude
  a differential amplifier exhibiting a predominantly capacitive input impedance,
  a first and a second group of at least one switching means, the first group of switching means independently directing the electric current delivered by each generator of the first group of at least one electric current generator either toward the first input or toward the second input of the differential amplifier and the second group of switching means independently directing the electric current originating either from the first input or from the second input of the differential amplifier toward each generator of the second group of at least one electric current generator, the inputs of said differential amplifier being connected in series between the two groups of switching means,
  the first group of switching means being controlled by the digital control code and the second group of switching means being controlled by the complementary code of said digital control code.

According to one embodiment, the current pump comprises a regulation module configured to regulate the mean amplitude of the voltage on one of the inputs of the differential amplifier, said regulation module receiving as input a signal representative of the amplitude of the voltage at said input of the differential amplifier as well as a reference voltage of predetermined amplitude and delivering as output a control signal in the direction of each generator of one of the two groups of electric current generator, said control signal being configured to modify the amplitude of the output currents of the generators so as to compensate a possible imbalance between the amplitudes of the current delivered by the complementary generators.

According to one embodiment, the device for generating analog signals comprises a predistortion module connected between the module for calculating the digital code with shaping of noise and the current pump, said predistortion module being configured to modify the digital code so as to create predistortion and compensate the non-linearities of the differential amplifier.

According to one embodiment, the device for generating analog signals comprises two groups of at least two electric current generators and two groups of at least two switching means.

According to one embodiment, the device for generating analog signals is integrated on one and the same integrated circuit.

The subject of the invention is also the use of the analog signals generating device described previously in a Delta modulator.

BRIEF DESCRIPTION OF THE DRAWINGS

Other features and advantages of the present invention will become more clearly apparent on reading the description hereinafter, given by way of nonlimiting illustration and with reference to the appended drawings, in which:

FIG. 1 represents an exemplary embodiment of an analog signals generating device 10 according to the invention.

DETAILED DESCRIPTION

This device 10 for generating arbitrary signals allows the construction of any analog signals by virtue of a digital coding of the temporal variations of the desired signal. The device comprises a digital part (not wholly represented) implementing the digital coding of the signal which generates binary trains, and which drives a current pump 12 making it possible to construct the analog signal by temporal integration of switched currents in a capacitive load. The digital part comprises a module 11 for calculating the digital code with shaping of noise making it possible to push a part of the quantization noise out of the frequency band of the analog signal generated, and thus improves its quality while keeping a restricted number of bits. This module 11 corresponds to the last stage of said digital part. The module 11 for calculating the digital code with shaping of noise is connected in series with the current pump 12 by way of an N-bit digital bus (with N an integer). The module 11 for calculating the digital code with shaping of noise receives as input a digital signal In corresponding to a digital representation on w bits (with w an integer strictly greater than N) of the desired analog signal at the output of said analog signal generating device 10. The function of this module 11 is to calculate the N bits discrete derivative of the analog signal to be generated.

The module 11 for calculating the digital code with shaping of noise can comprise one or more microprocessors, processors, computers or any other equivalent means programmed in an opportune manner.

Figure 1:
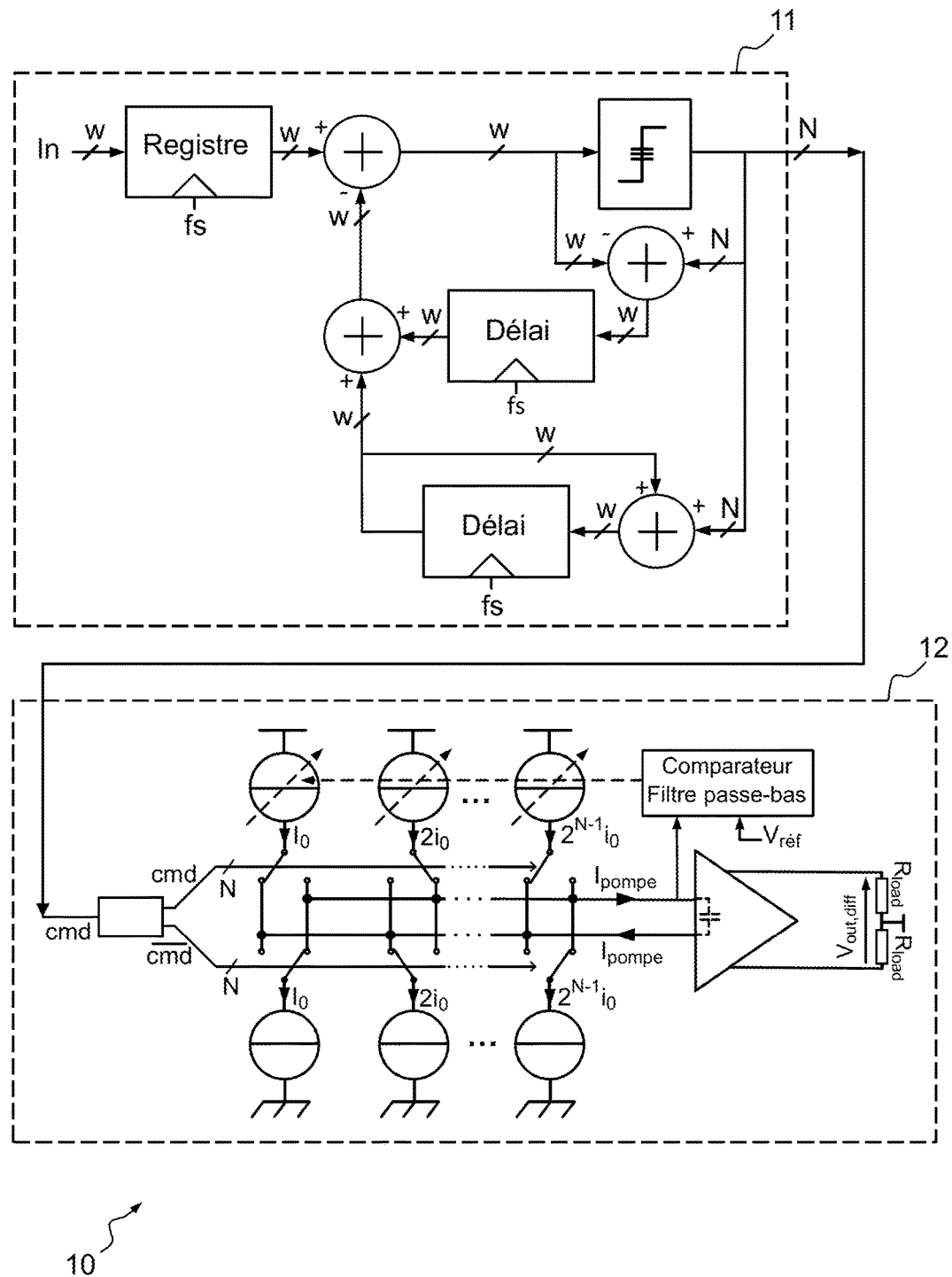
FIG. 1 represents an exemplary embodiment of a generator of analog signals according to the invention.
Figure 2:
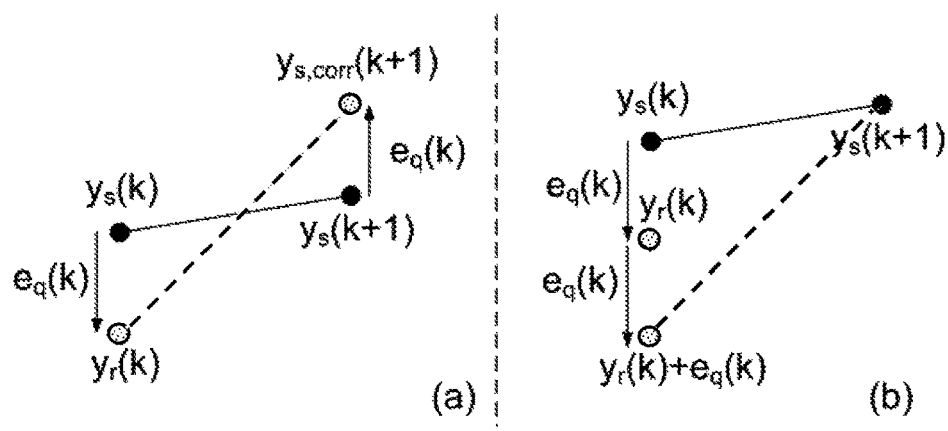
FIG. 2 illustrates the principle of the compensation of errors.
Figure 3A:
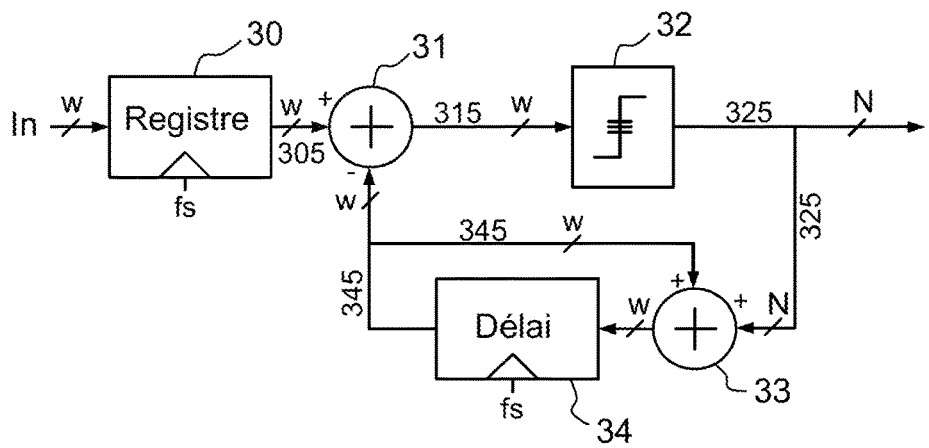
FIGS. 3a and 3b are examples of block diagrams illustrating the calculation of the Riemann code.
Figure 3B:
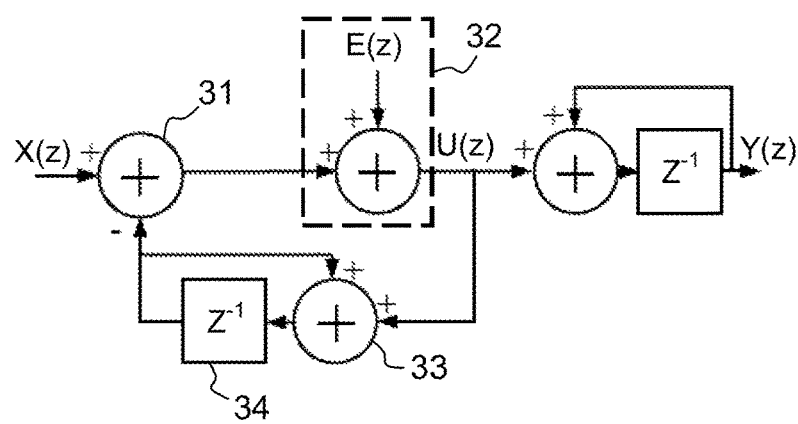
Figure 4A:
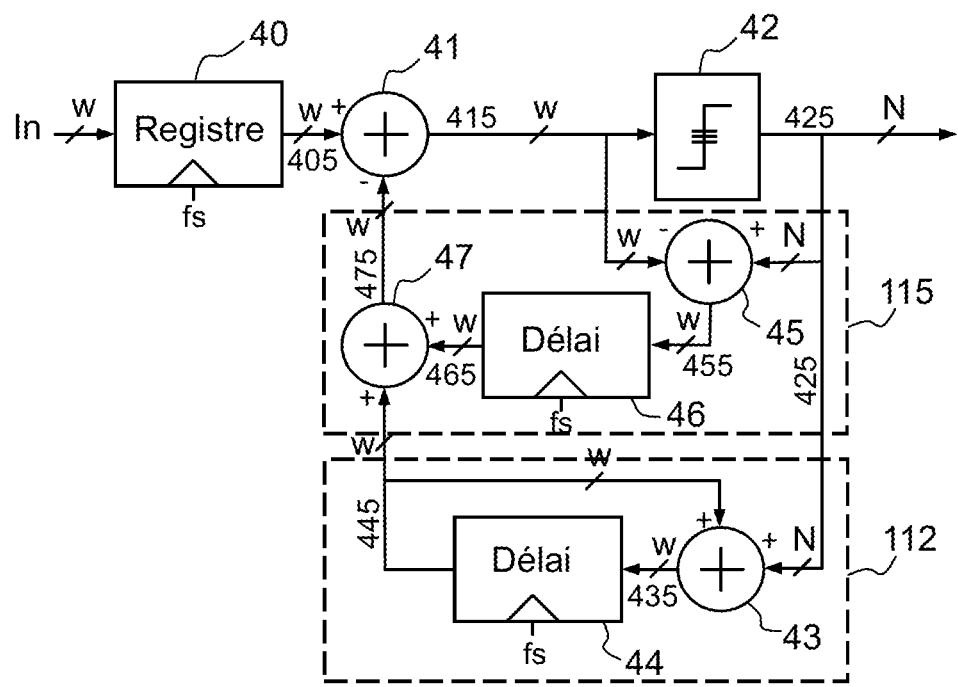
FIGS. 4a and 4b are examples of block diagrams illustrating the principle of noise shaping according to the invention.

With reference to FIGS. 2 to 4, the principle of the correction of errors will be explained.

FIG. 2 illustrates the principle of the compensation of errors in the time domain. Let y be the analog signal that it is desired to generate as output from the analog signals generating device 10. We denote by $y_s(k)$ the $k^{th}$ sample of the analog signal y that it is desired to generate, sampled at a frequency $f_s$ complying with the Nyquist criterion. $y_R(k)$ represents the $k^{th}$ sample of the signal of the signal calculated with the Riemann formulation. The quantization error of the $k^{th}$ sample is denoted $e_q(k)$ and is defined by:

$$e_q(k)=y_R(k)-y_s(k)$$

We refer to the diagram (a) of FIG. 2. In the example presented, after the $k^{th}$ iteration, there exists a quantization error $e_q(k)$ between the value of the sample $y_R(k)$ of the signal obtained and the value of the sample $y_s(k)$ of the theoretical signal. The value of $y_R(k)$ is less than that of the target sample $y_s(k)$.

In a conventional approximation code the target sample at the following iteration would be $y_s(k+1)$. The principle of the noise shaping code is to take account of the error made at the iteration k to calculate the sample $y_R(k+1)$ at the following iteration k+1. Accordingly, during the calculation of the sample $y_R(k+1)$ at the following iteration, instead of aiming at the theoretical value of the sample $y_s(k+1)$, the code will aim at a corrected value $y_{s\_corr}(k+1)$ of this sample integrating the error $e_q(k)$ of the previous iteration and defined by:

$$y_{s\_corr}(k+1)=y_s(k+1)-e_q(k)$$

With reference to the diagram b of FIG. 2, the code adds to the value of the sample $y_R(k)$ the quantization error $e_q(k)$ of the current iteration before the calculation of the following iteration. Thus when the sample $y_R(k+1)$ is calculated, the mean error between two samples is lowered.

FIG. 3 illustrates, with the aid of a block diagram, the principle of the calculation of the Riemann code without error compensation. The digital input signal In, sampled on w bits (with w an integer), is fed into a register 30. At the output of the register, from this signal 305 is subtracted the signal obtained at the previous iteration 345 through a summator 31. The resulting signal 315 is thereafter quantized on N bits (with N an integer less than w) through a quantizer 32. In order to reconstruct the signal, a part of the output signal 325 corresponding to the difference between the signal of the current iteration and that of the previous iteration is added to the signal obtained at the previous iteration 345 through a summator 33 and then passes through a retardation block 34 so as to delay it and synchronize it with that of the following iteration.

FIG. 4 illustrates, with the aid of an exemplary block diagram, the error compensation principle according to the invention. This diagram corresponds to the diagram presented previously in which a quantization error compensating stage 115 has been added. This compensating stage 115 is configured to add the quantization error to the reconstructed signal.

As previously, the block diagram comprises a register 40, a first summator 41 and a quantizer 42. The first summator 41 is configured to form the difference between the signal 405 of the current iteration obtained as output from the register 40 and that 475 of the previous iteration after compensation. The quantizer 42 makes it possible to quantize this difference of signals 415 on N bits.

The block diagram also comprises a loop 112 for reconstructing the signal of the current iteration comprising a summator summer 43 and a retardation block 44. The summator 43 is configured to add to a part of the output signal 425 a part of the signal 445 obtained at the previous iteration. The retardation block 44 is configured to delay the reconstructed signal 435 and thus synchronize it with that of the following iteration.

The quantization error compensating stage 115 comprises two summators 45, 47 and a retardation block 46. The first summator 45 is connected between the input and the output of the quantizer 42. This summator 45 is configured to subtract from the output signal 425 of said quantizer 42 the signal 415 present at its input so as to calculate the quantization error 455 made by said quantizer 42. The retardation block 46 is configured to delay the signal 455 corresponding to the quantization error so as to synchronize it with the signal of the following iteration. The second summator 47 is configured to add together the signal 455 corresponding to the quantization error and the reconstructed signal 445 so as to form the compensated signal.

As stated previously the output signal is coded on N bits and the calculation of the error is performed on w bits with w an integer greater than N. Indeed, the quantization error being less than the smallest significant bit (or LSB for "Less significant Bit") coded on N bits, the calculation of said quantization error must be performed with a better resolution, therefore coded on a number of bit w greater than N. In theory, the bigger the difference between w and N the more precise the calculations but in practice one or two additional bits suffice.

Figure 4B:
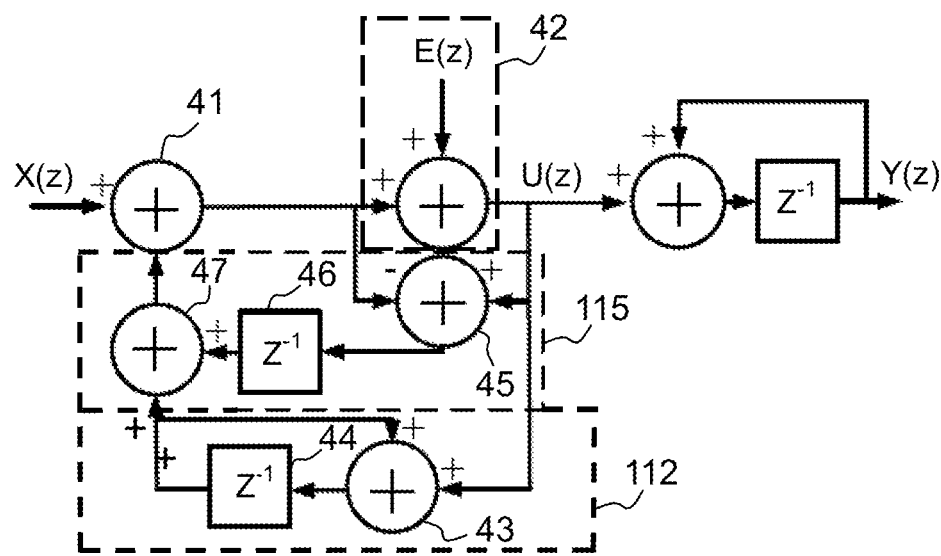

We refer to FIGS. 3b and 4b. In these block diagrams, the quantizer is modeled by an additional noise E(z).

In the Riemann code without error compensation, the transfer function $U_R$ with respect to the input signal X and to the quantization error E is given by the formula:

$$U_R(z)=X(z)\cdot(1-z^{-1})+E(z)\cdot(1-z^{-1})$$

And after integration, the output signal Y can be written in the form:

$$Y(z)=X(z)\cdot z^{-1}+E(z)\cdot z^{-1}$$

The transfer function U of the module for calculating the digital code with shaping of noise 11 according to the invention, with respect to the input signal X and to the quantization error E is given by the formula:

$$U(z)=X(z)\cdot(1-z^{-1})+E(z)\cdot(1-z^{-1})^2$$

After integration, the output signal Y can be written in the form:

$$Y(z)=X(z)\cdot z^{-1}+E(z)\cdot z^{-1}\cdot(1-z^{-1})$$

As previously, the signal X and the quantization error E are multiplied by $z^{-1}$ and therefore are delayed but the quantization error is also multiplied by $(1-z^{-1})$, this corresponding to a filtering of first-order high-pass type. The addition of the quantization error compensating stage 115 in the module for calculating the digital code with shaping of noise 11 makes it possible to reject a part of the quantization noise out of the frequency band of the analog signal generated.

Higher-order error compensation loops could be implemented so as to improve performance by reducing the quantization noise, but this would be to the detriment of simplicity of implementation, of passband and of stability.

Figure 5:
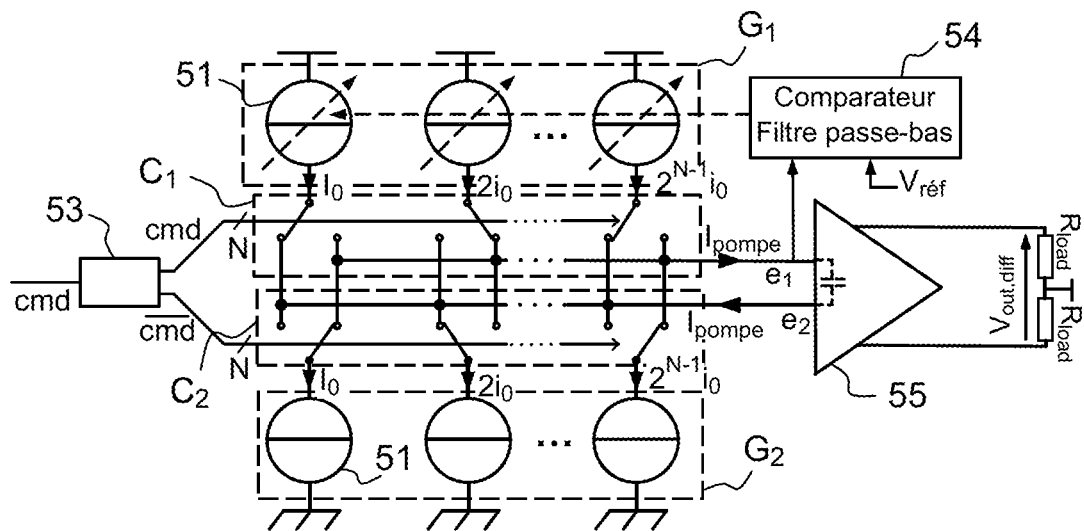
FIG. 5 represents an exemplary embodiment of a current pump according to the invention

FIG. 5 represents an exemplary embodiment of a current pump 12 according to the invention. This current pump comprises current blockers of order one. The role of this circuit is to construct the desired analog signal on the basis of the digital code or digital control signal cmd coded on N bits and delivered by the errors compensating module 11 described previously. Accordingly, the current pump 12 comprises two groups G1, G2 of at least one electric current generator 51, two groups C1, C2 of at least one switching 52 and a differential amplifier exhibiting a predominantly capacitive input impedance. The invention employs a complementary system of two groups G1, G2 of at least one electric current generator 51 with a capacitive load consisting of the amplifier's input stage connected in series between these two groups G1, G2.

Each electric current generator 51 of one generator group G1 delivers a current of adjustable amplitude while the amplitude of the generator or generators of the other group G2 is fixed.

Each electric current generator 51 of the first generator group G1 is complementary to a generator 51 of the second generator group G2. Two complementary electric current generators 51 deliver currents of the same amplitude but of opposite sign. A first generator 51 group G1 pushes the current and a second group G2 pulls it. Each electric current generator 51 delivers a current of amplitude $+/-2^{n-1}I_0$ in which n is an integer representing the rank of the current generator and varying from 1 to N and $I_0$ the value of a predetermined current amplitude.

A first group C1 of switching means 52 independently directs the electric current delivered by each generator 51 of the first group G1 of at least one electric current generator 51 either toward the first input e1 or toward the second input e2 of the differential amplifier 55. A second group C2 of switching means 52 independently directs the electric current originating either from the first input e1 or from the second input e2 of the differential amplifier 55 toward each generator 51 of the second group G2 of at least one electric current generator 51. Each switching means 52 is activated or deactivated by the control signal. The switching facilities of the first group C1 are controlled by the control signal cmd and the second group C2 is controlled by its complementary signal $\overline{\text{cmd}}$. For this purpose, a module 53 is connected at the input of the current pump 12. This module 53 receives the control signal cmd as input and delivers said control signal cmd and its complement $\overline{\text{cmd}}$ as output.

Each group C1, C2 of switching means 52 and each group G1, G2 of current generator 51 comprise as many switching means as electric current generator. Each of the switching means 52 is connected in series between a current generator 51 and an input e1, e2 of the differential amplifier 55. The amplitude of the current flowing through each input e1, e2 of the differential amplifier 55 is therefore dependent on the number and the rank of the activated switching means In the embodiments in which each group G1, G2 of electric current generator 51 and each group C1, C2 of switching means 52 comprise at least two elements, the electric current generators connected in series with their respective switching means are connected together in parallel. The differential amplifier 55 is connected in series between the two groups C1, C2 of switching means 52.

In an advantageous manner, the amplifier 55 is supplied differentially thereby making it possible to decrease its consumption with respect to an asymmetric power supply.

Likewise, when the digital input code does not vary, the current sources are observed to be turned off. Indeed, the capacitive load being connected in series with the current sources, there can be no direct current passing through this load, and therefore no DC consumption of the current sources. As soon as a variable digital signal is dispatched on the inputs, the association of the current sources with the capacitor connected in series self-biases in its operating zone. The consumption of the signals generating device 10 is thereby reduced with respect to a conventional architecture since the system is automatically turned off as soon as there is no need to generate a signal.

Figure 6:
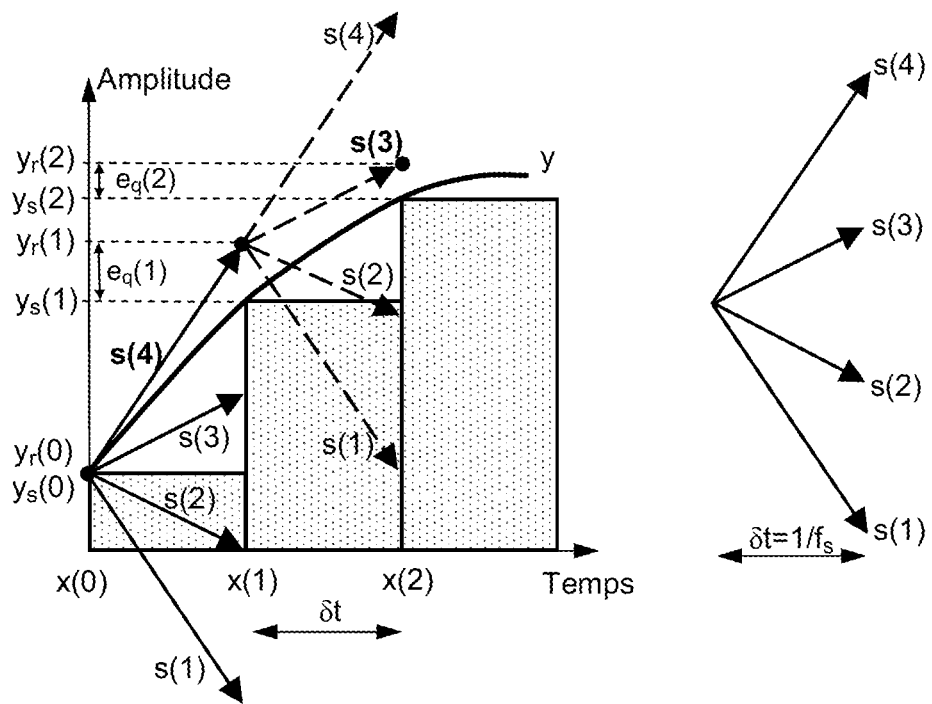
FIG. 6 illustrates the principle of the construction of an analog signal according to the invention.

With reference to FIG. 6, the construction of the analog signal to be generated relies on the decomposition of this signal into piecewise linear functions. In this figure, y is the graphical representation of the analog signal as a function of time. Various instants x(0), x(1), x(2), . . . and the values of the respective amplitudes ys(0), ys(1), ys(2) of the signal y at these instants are considered. Also considered are four linear functions with predetermined director coefficients, represented by the portions of straight lines S(1), S(2), S(3) and S(4) corresponding to the curves representative of these functions over the interval δt separating two consecutive instants x(i) and x(i+1) corresponding to the sampling step size. The director coefficient of each linear function will define a different slope.

The objective is to generate a linear function piecewise with the aid of the various predetermined linear functions, which will approximate the desired signal y. Accordingly, at each instant x(i) a linear function will be chosen from among the set of predetermined functions in such a way as to minimize the error eq(i) between the value ys(i) of the amplitude of the signal y at the instant x(i) and the value yr(i) of the chosen linear function at this same instant.

With reference to FIG. 5, according to the number of switching means 52 activated and the rank of the activated switching means or facilities, the current passing through the input impedance of the differential amplifier 55 is bigger or smaller. The principle of the current pump 12 is based on the integration of constant currents in the, predominantly capacitive, input impedance of the differential amplifier 55 so as to generate a piecewise analog signal. The input impedance of the amplifier 55 may be likened to an RC circuit (in which R represents a resistor and C a capacitor) which charges more or less rapidly as a function of the current which passes through it and of the time during which this current flows. According to the current generated, several predefined linear functions possessing different director coefficients and therefore different slopes can be generated so as to approximate the analog signal to be generated. With two groups G1, G2 of N electric current generators 51, $2^N$ different linear functions can be defined.

In an advantageous manner, the pairing of the currents delivered allows good balancing of the positive and negative slopes.

According to one embodiment, the current pump 12 comprises a regulation module 54 configured to regulate the mean value of the amplitude of the voltage on one of the terminals of the differential amplifier, between an input e1 or e2 of the differential amplifier 55 and the ground. Accordingly, the regulation module 54 is connected to one of the two groups G1, G2 of current generator 51 and receives as input a signal representative of the amplitude of the voltage at said terminal or input e1, e2 of the differential amplifier 55 as well as a reference voltage of predetermined amplitude.

The regulation module 54 compares the mean value of the voltage between an input of the differential amplifier 55 and the ground with the reference signal and delivers as output a control signal in the direction of each generator 51 of one of the two groups G1, G2 of electric current generator 51. This control signal is configured to modify the amplitude of the output currents of the generators 51 in such a way as to compensate a possible imbalance with the amplitudes of the current delivered by the complementary generators 51. The current delivered by the current generators 51 being switched in a balanced manner either onto one or onto the other of the two inputs of the differential amplifier 55, no DC voltage is established between these two branches. It is therefore possible to regulate the common mode by slaving the mean voltage between one of the two input branches of the differential amplifier and the ground.

The aim of the regulation module 54 is to balance the two groups G1, G2 of electric current generator 51 so as to prevent the mean voltage from drifting temperature-wise in particular.

According to an alternative embodiment, the regulation module 54 can deliver as output a control signal in the direction of each of the generators 51 of the two groups G1, G2 of electric current generator 51.

In a preferential manner, for more stability, the regulation module 54 regulates only a single of the two groups of current generator so as to balance it with respect to the second one.

According to one embodiment, the signals generating device 10 can comprise a predistortion module 13 in series between the module 11 for calculating the digital code with shaping of noise and the current pump 12. This predistortion module 13 is configured to generate a digital signal able to compensate possible non-linearities of the differential amplifier 55. Compensation of the non-linearities of an amplifier is a well-known technique and can be carried out via any method known to the person skilled in the art. It can be carried out, for example, by modifying the digital code so as to create predistortion.

According to one embodiment, the signals generating device 10 can be integrated on one and the same chip, an integrated circuit or an Application Specific Integrated Circuit (ASIC).

In an advantageous manner, the analog signals generating device 10 according to the invention makes it possible to produce a digital-analog converter having a much lower electrical consumption than that of a conventional converter at the same speed. The device 10 makes it possible to generate analog signals of good performance with moderate complexity. Indeed the device 10 requires only few component thus reducing the cost thereof and above all its very low energy consumption minimizes its impact on autonomy. The latter point is very advantageous for use in mobile telephony, in the wireless sector or in a drone where autonomy is a key parameter.

Another advantage of the analog signals generating device 10 according to the invention is that it makes it possible to reduce the common mode noise.

Figure 7:
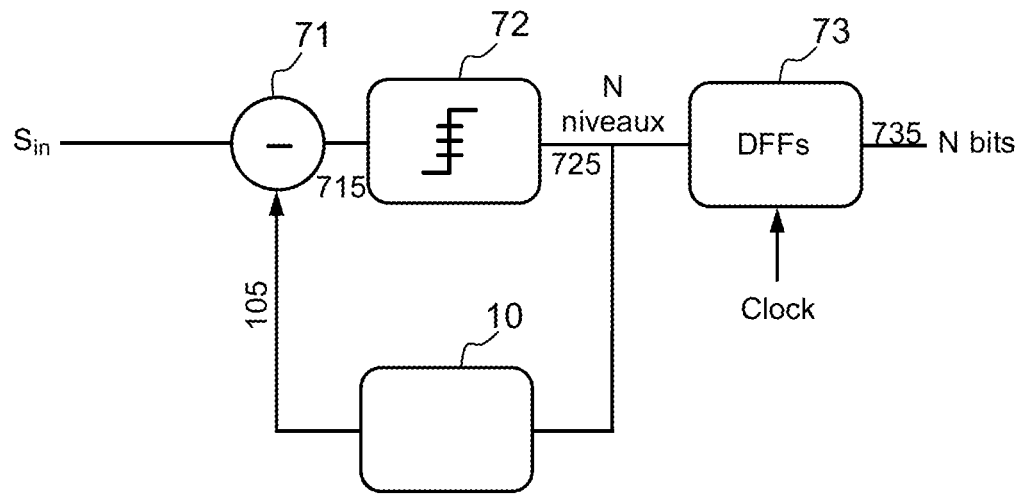
FIG. 7 represents an exemplary use of the signals generating device according to the invention.

FIG. 7 presents an exemplary possible use of the signals generating device 10 in a Delta modulator. This Delta modulator comprises a summator 71, a quantizer 72, a module 73 for reshaping the clocks (or DFF for "Delay Flip Flop" according to the usual terminology) and an analog signals generating device 10 such as described previously.

The input signal $S_{in}$ of the Delta modulator is subtracted from the reconstructed value of this signal after quantization by way of a summator 71. The output signal 715 of said summator 71 is thereafter quantized on N levels with the aid of a quantizer 72. The output signal 725 on N levels is thereafter digitized through a module 73 for reshaping the clocks so as to synchronize the various levels with respect to a clock signal clock.

A part of the output signal 725 of the quantizer 72 is directed toward an analog signals generating device 10 so as to reconstruct the input signal after quantization.

Figure 8:
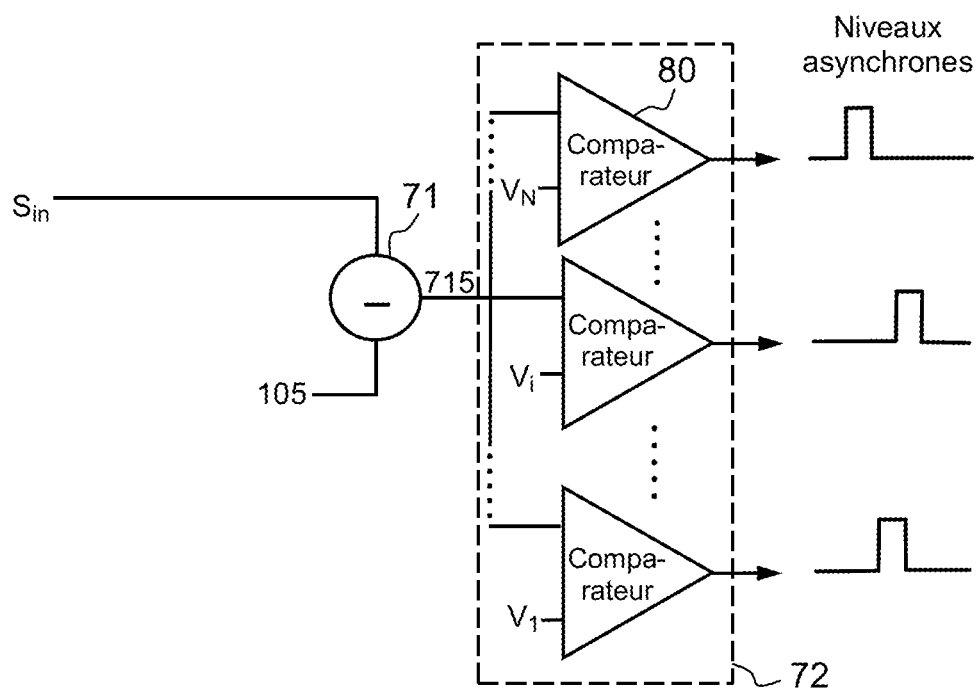
FIG. 8 represents an exemplary embodiment of a quantizer.

By way of illustration, FIG. 8 presents an exemplary embodiment of a quantizer 72 with the aid of N comparator 80. Each comparator 80 compares the voltage of the signal 715 at the output of the summator 71 with a reference voltage characteristic of a reference level.

The invention claimed is:

1. An analog signals generating device comprising a current pump controlled by a digital control code generated by a module for calculating the digital code with shaping of noise, said module for calculating the digital code with shaping of noise comprising at least one quantizer and receiving as input a digital signal representative of the analog signal to be generated, said device wherein said module for calculating the digital code with shaping of noise comprises a quantization error compensating stage, and wherein said current pump comprises:

a first and a second group of at least one electric current generator, each generator of the first group being complementary to a generator of the second group, two complementary generators delivering currents of opposite amplitude a differential amplifier exhibiting a predominantly capacitive input impedance, a first and a second group of at least one switching means, the first group of switching means independently directing the electric current delivered by each generator of the first group of at least one electric current generator either toward a first input or toward a second input of the differential amplifier and the second group of switching means independently directing the electric current originating either from the first input or from the second input of the differential amplifier toward each generator of the second group of at least one electric current generator, the inputs of said differential amplifier being connected in series between the two groups of switching means, the first group of switching means being controlled by the digital control code and the second group of switching means being controlled by a complementary code ($\overline{cmd}$) of said digital control code; and, said current pump further comprising a regulation module configured to regulate a mean amplitude of a voltage on one of the inputs of the differential amplifier, said regulation module receiving as input a signal representative of the amplitude of the voltage at said input of the differential amplifier as well as a reference voltage of predetermined amplitude and delivering as output a control signal in a direction of each generator of one of the two groups of electric current generator, said control signal being configured to modify the amplitude of an output currents of the generators so as to compensate a possible imbalance between the amplitudes of the current delivered by the complementary current generators.

2. The device as claimed in claim 1, wherein said device comprises a predistortion module connected between the module for calculating the digital code with shaping of noise and the current pump, said predistortion module being configured to modify the digital code so as to create predistortion and compensate non-linearities of the differential amplifier.

3. The device as claimed in claim 1, wherein said device comprises two groups of at least two electric current generators and two groups of at least two switching facilities.

4. The device as claimed in claim 1, wherein said device is integrated on one and the same integrated circuit.

5. A Delta modulator device comprising the analog signals generating device of claim 1 and further comprising:

a summator, a quantizer, and a module for reshaping clocks.

* * * * *